(12) United States Patent
Jeon et al.

(10) Patent No.: US 12,400,880 B2
(45) Date of Patent: Aug. 26, 2025

(54) APPARATUSES FOR UNIFORM FLUID DELIVERY IN A MULTI-STATION SEMICONDUCTOR PROCESSING CHAMBER

(71) Applicant: Lam Research Corporation, Fremont, CA (US)

(72) Inventors: Eli Jeon, Sherwood, OR (US); Michael Philip Roberts, Tigard, OR (US); Douglas Walter Agnew, Portland, OR (US); Daniel Boatright, Estacada, OR (US); Arun Anandhan Duraisamy, Wilsonville, OR (US); Joseph R. Abel, West Linn, OR (US); William Laurence McDaniel, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 24 days.

(21) Appl. No.: 18/557,043

(22) PCT Filed: Apr. 28, 2022

(86) PCT No.: PCT/US2022/026810
§ 371 (c)(1),
(2) Date: Oct. 24, 2023

(87) PCT Pub. No.: WO2022/235487
PCT Pub. Date: Nov. 10, 2022

(65) Prior Publication Data
US 2024/0222151 A1  Jul. 4, 2024

Related U.S. Application Data

(60) Provisional application No. 63/201,519, filed on May 3, 2021.

(51) Int. Cl.
*H01L 21/67* (2006.01)

(52) U.S. Cl.
CPC .............................. *H01L 21/67017* (2013.01)

(58) Field of Classification Search
CPC ....... Y10T 137/87249; H01L 21/67017; H01L 21/6719; C23C 16/45561; C30B 25/165
See application file for complete search history.

(56) References Cited

U.S. PATENT DOCUMENTS 10,087,523 B2 * 10/2018 Collins .............. C23C 16/45544
10,385,474 B2 *  8/2019 Sato ....................... C30B 25/165
(Continued)

FOREIGN PATENT DOCUMENTS

| JP | 2003086672 A | * | 3/2003 |
| KR | 20060037550 A | * | 5/2006 |
| WO | WO-2013062778 A1 | | 5/2013 |

OTHER PUBLICATIONS

International Preliminary Report on Patentability and Written Opinion dated Nov. 16, 2023 in PCT Application No. PCT/US2022/026810.

(Continued)

*Primary Examiner* — Jessica Cahill
(74) *Attorney, Agent, or Firm* — Weaver Austin Villeneuve & Sampson LLP

(57) ABSTRACT

The present disclosure relates to a system for a semiconductor processing. The system includes a semiconductor processing chamber having a plurality of processing stations, a plurality of manifold trunks, a plurality of valves, and a plurality of fluid manifolds. Each manifold trunk includes an outlet, a common flowpath, a plurality of trunk inlets, a plurality of orifices, and a plurality of valve interfaces.

24 Claims, 6 Drawing Sheets

(56) References Cited

U.S. PATENT DOCUMENTS

| | | | |
|---|---|---|---|
| 2004/0163590 A1* | 8/2004 | Tran | C23C 16/45561 118/715 |
| 2007/0071896 A1* | 3/2007 | Murphy | C23C 16/45563 118/715 |
| 2010/0316800 A1 | 12/2010 | Chang et al. | |
| 2013/0104996 A1* | 5/2013 | Oh | F16K 11/00 137/861 |
| 2016/0032488 A1* | 2/2016 | Takahashi | C30B 29/406 118/712 |
| 2020/0071826 A1* | 3/2020 | Lavoie | C23C 16/52 |

OTHER PUBLICATIONS

International Search Report and Written Opinion dated Aug. 16, 2022 in Application No. PCT/US2022/026810.

* cited by examiner

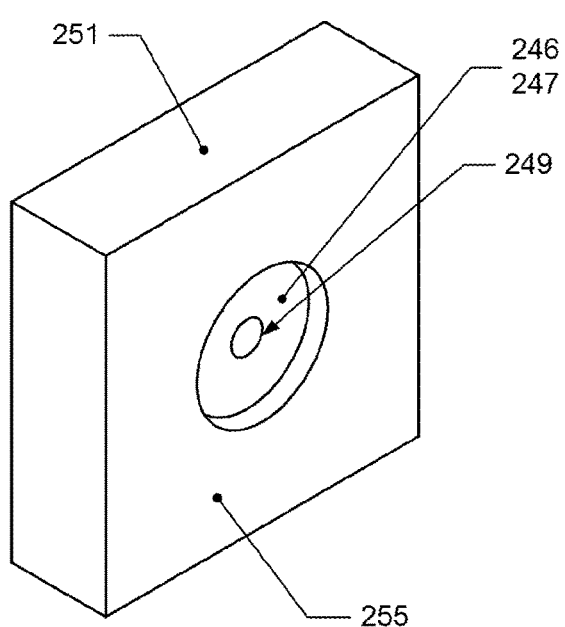
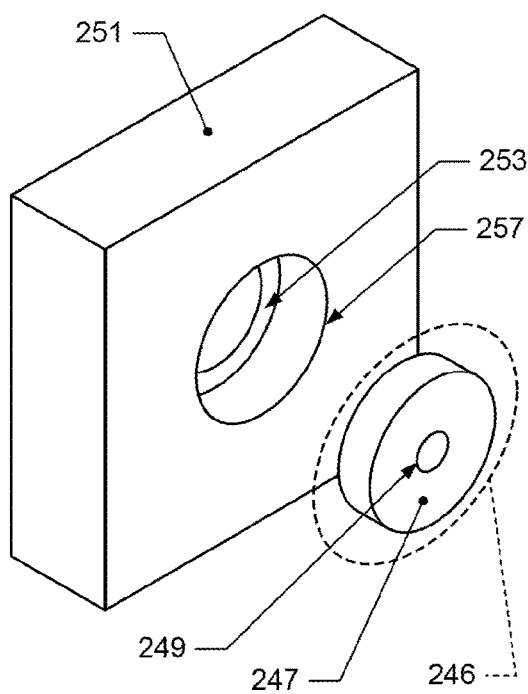
Figure 2A                    Figure 2B
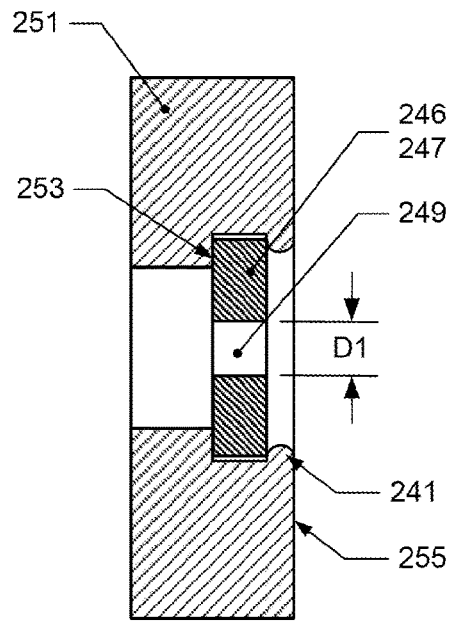
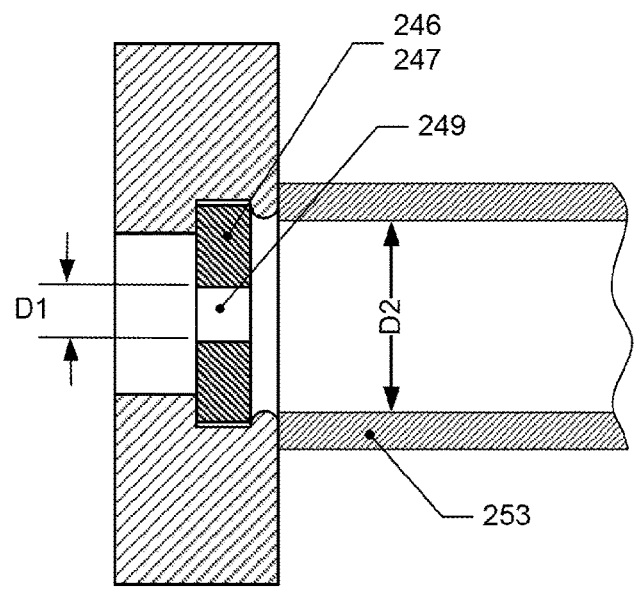
Figure 2C                    Figure 2D

APPARATUSES FOR UNIFORM FLUID DELIVERY IN A MULTI-STATION SEMICONDUCTOR PROCESSING CHAMBER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

During semiconductor processing operations, a substrate is typically supported on a pedestal within a processing chamber and process gases are flowed into the chamber in order to deposit one or more layers of material onto the substrate, or to remove one or more layers of material from a substrate. In commercial scale manufacturing, each substrate, or wafer, contains many copies of a particular semiconductor device being manufactured, and many substrates are required to achieve the required volumes of devices. The commercial viability of a semiconductor processing operation depends in large part upon within-wafer uniformity and wafer-to-wafer repeatability of the process conditions, as well as station-to-station uniformity. Accordingly, efforts are made to ensure that each portion of a given wafer and each wafer processed are exposed to the same processing conditions. Variation in the processing conditions and the semiconductor processing tool can cause variations in deposition conditions resulting in unacceptable variation in the overall process and product. Apparatuses to minimize process variation are required.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 2A depicts an off-angle view of an example orifice positioned within an orifice plate.

FIG. 2B depicts an exploded view of the orifice and orifice plate of FIG. 2A.

FIG. 2C depicts a cross-sectional side view of the orifice and orifice plate of FIG. 2A.

FIG. 2D depicts the cross-sectional side view of the orifice and orifice plate of FIG. 2C along with a section of piping.

DETAILED DESCRIPTION

Figure 1:
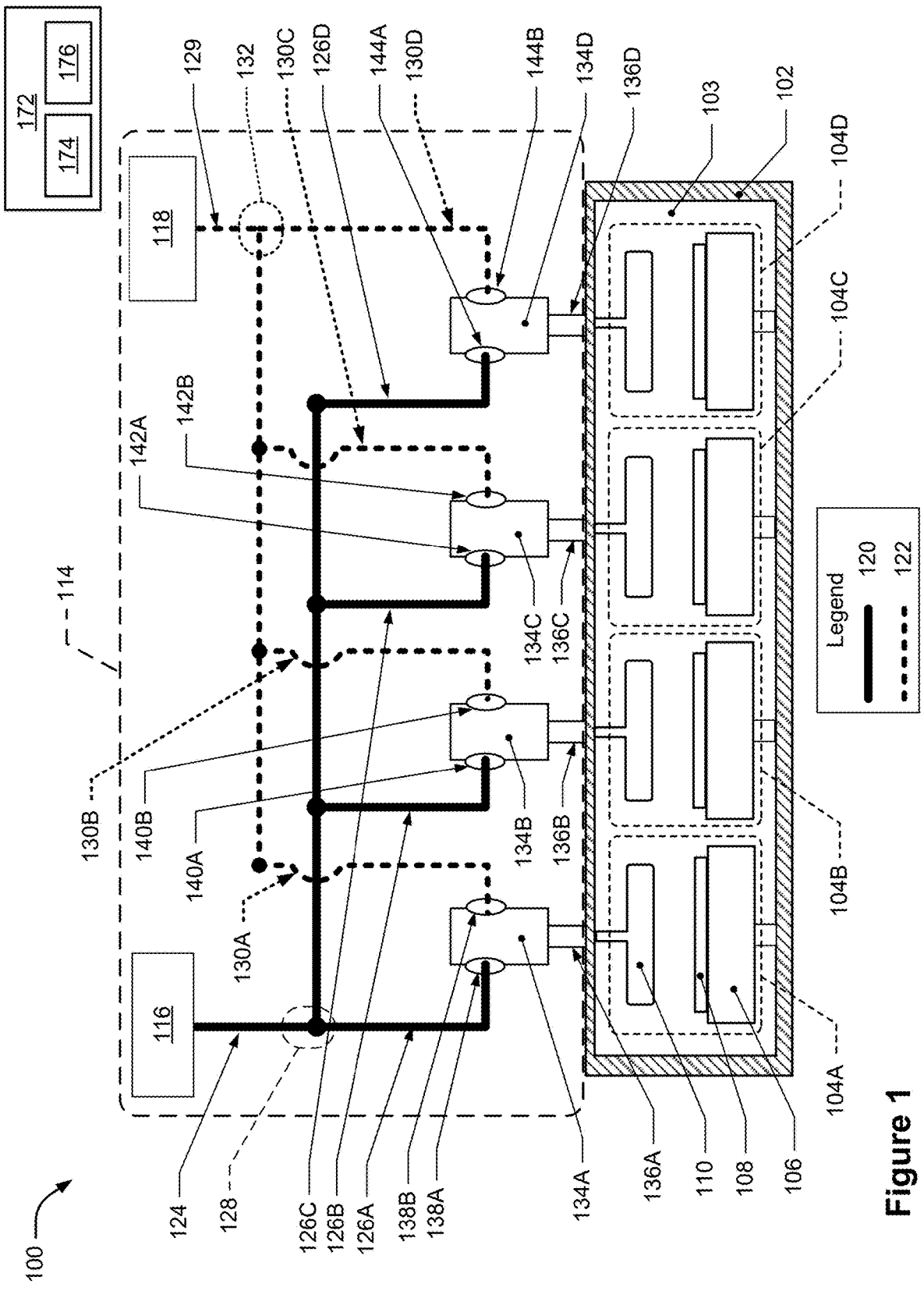
FIG. 1 depicts an example multi-station semiconductor processing tool according to disclosed embodiments.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Definitions

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented for use with such a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

Introduction and Context

Multi-station semiconductor processing tools ("multi-station tools") have two or more processing stations within a single processing chamber which can lead to numerous advantages, such as increasing throughput by enabling parallel processing of multiple wafers while at the same time utilizing common processing equipment between the various stations. For instance, in a chamber with four processing stations, four substrates placed in the four separate stations may be processed at the same time. Many multi-station tools have a process fluid delivery system that delivers numerous process fluids, such as process gases, liquids, and/or vapors, to each station by flowing the each process fluid from a common source through a manifold that has one or more junction points and multiple legs, or flowpaths, to a gas dispersion device, e.g., a showerhead, at each station. In order to deliver multiple process fluids to the multi-station chambers, many multi-station tools have a plurality of manifolds that each connect a different fluid source to each of the stations. Flowing fluid from a single fluid source to multiple stations using such manifolds presents numerous advantages, such as increased efficiencies, and reduced costs, for example.

The present inventors discovered that aspects of fluid delivery systems for some multi-station tools can lead to various undesirable flow conditions that can cause station-to-station nonuniformity. These undesirable effects have been found to occur when fluid flowrates are in a "low-flow" regime which may be considered less than about 3 standard liters per minute ("slm"), including less than or equal to about 2 slm, about 1.5 slm, about 1 slm, or about 0.5 slm. For example, in a multi-station deposition tool, material was deposited using process gases that were flowed in the low-flow regime, and different station-to-station deposition rates resulted which affected the thickness of the deposited material and increased the station-to-station thickness nonuniformity.

The present inventors found that flow imbalances in the process fluid delivery systems, cross-talk between manifolds, or both, can lead to the undesirable station-to-station nonuniformity, such as nonuniform station-to-station flowrates, when fluid is flowed in the low-flow regime. Although the manifolds and fluid delivery flowpaths from each fluid source to the wafer are designed and built to be as identical and uniform as possible, these flowpaths nevertheless have inherent variabilities, such as manufacturing or assembly variabilities of valves, fluid conduits and elements, and gas distribution devices, for example. These inherent variabilities may result in station-to-station flowrate nonuniformity that remains relatively fixed at most given process conditions.

For example, at relatively high, or non-low-flow, flowrates, such as above 3.5 slm or 5 slm, the inherent station-to-station flowrate differences are relatively small compared to the fluid flowrate such that they may not affect process conditions for performing semiconductor device fabrication operations in earlier technology nodes or in single station reactors. However, at low-flow flowrates, the station-to-station flowrate difference is relatively large compared to the fluid flowrate and can significantly affect the flow balance and flow conditions at and between stations. In a simplified example, a multi-station tool may have an inherent station-to-station flowrate difference that is approximately 0.5 slm which is relatively small compared to high flowrates such as 5 slm, but is relatively large compared to a flowrate of 2 slm that may be split between four stations and result in a flowrate of 0.5 slm to each station. In this simplified illustration, the flowrate of 0.5 slm to each station is about equal with the station-to-station flowrate difference of 0.5 slm which can result in significant station-to-station variability at these low flowrates.

Undesirable cross-talk has also been observed between multiple manifolds of a multi-station tool. "Cross-talk" may be considered fluid that unintentionally flows from one manifold to another manifold. As mentioned above, the numerous process fluids are delivered to the stations in a multi-station tool through a plurality of manifolds, and each manifold may correspond with a different fluid source and have multiple legs that are each fluidically connected to one corresponding station. Each process fluid may flow through a separate manifold to the stations in the multi-station tool. Each station may have a common junction, referred to herein as a "manifold trunk," where the inlets for each station come together, i.e., a common location where a leg of each of the multiple manifolds is physically and fluidically connected to the station. The manifold trunk may therefore have multiple inputs that are each fluidically connected to one leg of each manifold. The present inventors found that some multi-station tools do not have valves for fluidically isolating the manifold trunk from each manifold, which allows fluid to flow from one leg of one manifold, through the manifold trunk to which it is connected, and into another manifold; this is an example of cross-talk between manifolds. This cross-talk may create a flow imbalance within the one manifold through which fluid is intentionally flowing and may create an additional flow imbalance between stations by allowing the fluid to flow into the other manifold and to one or more stations.

The present inventors determined that utilizing flow restrictors, or orifices, to create choked flow in each leg of each manifold can result in a more uniform and balanced station-to-station flow. By using a choked flow regime, the fluid flowing from each manifold leg to a processing station becomes insensitive to downstream pressure variations and inherent variabilities at each station. Further, the present inventors determined that using isolation valves at the manifold trunk for each leg of each manifold at each station can prevent cross-talk between the manifolds.

Systems and Apparatuses

Aspects of this disclosure pertain to reducing nonuniform station-to-station fluid flow and reducing cross-talk between manifolds in multi-station semiconductor processing tools. The multi-station tools provided herein have a plurality of fluid delivery manifolds that each have multiple legs fluidically connected to a corresponding manifold trunk at each station. The multi-station tools may also include a plurality of flow restrictors, such as orifices, positioned at or near the manifold trunks and that are used to create choked flow within each leg of each manifold. Each manifold trunk may be fluidically connected with one corresponding station, have multiple inlets that are each fluidically connected with one leg of a corresponding manifold, and have an orifice fluidically interposed between each inlet and leg.

With an orifice positioned between each inlet of each manifold trunk and the corresponding leg fluidically connected to that inlet, choked flow is created from each manifold leg into each manifold trunk and the corresponding station. Each orifice may have an orifice body and a hole through the orifice body, and in some implementations, the orifice body may be swaged into an orifice plate that is removably connected to the manifold trunk. In some embodiments, the orifice body may be made of ruby to enable lower manufacturing tolerances than with other materials and manufacturing means, such as machining a metal.

In some other implementations that have a manifold with a single, common multi-leg split between multiple legs which, in some embodiments may be of equal or substantially equal lengths, each orifice may be positioned along each leg relatively close to the common multi-leg split in order to create choked flow within each leg of the manifold. In some such implementations, each orifice may be positioned away from the multi-leg split by a distance that is less than or equal to 20%, 10%, or 5%, of the respective length of the leg to which it is connected.

The multi-station tools may also have a plurality of valves that are each positioned at each inlet of the manifold trunks in order to prevent cross-talk between the manifolds. These valves are configured to regulate fluid flow between the manifold leg and the orifice corresponding to each inlet of the manifold trunk. Each manifold trunk may therefore include valve interfaces to which the valves are configured to interface and connect. In some implementations that use orifice plates, the valve interface may be a part of the orifice plate and a valve may interface directly with the orifice plate. Additionally, in some implementations, the leg of each manifold may terminate at the valve whereas in other implementations, the leg may terminate at a valve interface surface of the manifold trunk.

FIG. 1 depicts an example multi-station semiconductor processing tool according to disclosed embodiments. This multi-station tool 100 includes a processing chamber 102 with four processing stations 104A-104D that are each encompassed by a dotted rectangle. The processing chamber 102 has a top, bottom, and sidewalls that at least define a chamber interior 103 in which the stations 104A-D are positioned. Each station includes a pedestal 106, a substrate 108 on the pedestal 106, and a showerhead 110; these items are labeled in processing station 104A.

The multi-station tool 100 also includes a fluid delivery system 114 (encompassed within the dashed rectangle) fluidically coupled to each processing station 104A-104D for delivering process fluids to the showerheads 110. The process fluids may include liquids and/or gases, such as film precursors, carrier and/or purge and/or process gases, secondary reactants, etc. The fluid delivery system 114 includes a plurality of gas sources, two of which are illustrated as a first fluid source 116 and a second fluid source 118, and a plurality of manifolds for delivering the process fluids from each gas source to each processing station 104A-D. Although not depicted, the fluid delivery system 114 may include other features such as additional fluid sources, such as at least three, four, six, eight, ten, or twenty fluid sources, one or more mixing vessels, vaporization points for vaporizing liquid reactant to be supplied to a mixing vessel, as well as various valves, manifolds, heaters, and gas lines to direct and control the flow of fluids throughout the fluid delivery system 114; some of these features are described in more detail below. The showerhead 110 distributes process gases and/or reactants (e.g., film precursors) toward the substrate 108 at the corresponding processing station.

In FIG. 1, the fluid delivery system 114 is illustrated with two manifolds, a first manifold 120, depicted with a heavy solid line, and a second manifold 122, depicted with a heavy dotted line as indicated by the Figure Legend. The first manifold 120 includes a common input 124 that may form a single fluidic connection with the first fluid source 116, and includes a plurality of legs 126A-D that are each fluidically connected to one corresponding station 104A-D, respectively. The common input 124 may have a point 128 that represents where the manifold first splits into multiple legs. In some implementations, the first manifold 120 may have multiple divisions and splits (not shown) which result in the first manifold 120 having four individual legs 126A-D that each terminate at a different, corresponding station 104A-D, respectively. For example, as illustrated in FIG. 1, for the first manifold 120 at or after the point 126 of the common input 124, a first leg 126A is fluidically connected to the first processing station 104A, a second leg 126B is fluidically connected to the second processing station 104B, a third leg 126C is fluidically connected to the third processing station 104C, and a fourth leg 126D is fluidically connected to the fourth processing station 104D. In some embodiments, each of the legs 126A-D may have the same length or substantially the same length.

The second manifold 122 in FIG. 1 includes a common input 129 that may form a single fluidic connection with the second fluid source 118, and includes a plurality of legs 130A-D that are each fluidically connected to one corresponding station 104A-D, respectively. The common input 129 may have a point 132 that represents where the second manifold 122 splits into multiple legs. In some implementations, the second manifold 122 may have multiple divisions and splits (not shown) which result in the second manifold 120 having four individual legs 130A-D that each terminate at a different, corresponding station 104A-D, respectively. As illustrated in FIG. 1, for the second manifold 122, at or after the point 132 of the common input 129, a first leg 130A is fluidically connected to the first processing station 104A, a second leg 130B is fluidically connected to the second processing station 104B, a third leg 130C is fluidically connected to the third processing station 104C, and a fourth leg 130D is fluidically connected to the fourth processing station 104D. In some embodiments, each of the legs 130A-D may have the same length or substantially the same length. To illustrate the individual legs in this FIG. 1, each leg 126A-D and 130A-D extends from a corresponding upstream, solid circle of the respective first or second manifold.

In order for each leg of each manifold to fluidically connect with each processing station, the multi-station tool 100 includes a plurality of manifold trunks 134A-D that each correspond to one of the processing stations 104A-D, and that each have a plurality of trunk inlets that are each configured to be fluidically connected with one leg of a manifold. Each manifold trunk 134A-D is fluidically connected to a corresponding station inlet 136A-D, respectively, of each station 104A-D. Each station inlet 136A-D is fluidically connected to the showerhead of the corresponding station 104A-D, respectively, such that fluid flows to the showerhead of a station through that station's station inlet. For example, fluid may flow through station inlet 120A to showerhead 110 of station 104A. As illustrated in FIG. 1, manifold trunk 134A corresponds with station 104A and is fluidically connected to station inlet 136A and station 104A; manifold trunk 134B corresponds with station 104B and is fluidically connected to station inlet 136B and station 104B; manifold trunk 134C corresponds with station 104C and is fluidically connected to station inlet 136C and station 104C; and manifold trunk 134D corresponds with station 104D and is fluidically connected to station inlet 136C and station 104C.

Each manifold trunk includes a plurality of trunk inlets, such two inlets as illustrated in FIG. 1. Each trunk inlet is fluidically connected to one leg of one manifold; each leg of each manifold is therefore connected to one trunk inlet of one trunk manifold for one corresponding station such that the legs are each fluidically connected to a different processing station. In some implementations, each manifold trunk has at least the same number of trunk inlets as manifolds, and each manifold includes at least the same number of legs as stations. For example, manifold trunk 134A includes a first trunk inlet 138A and a second trunk inlet 138B (both of which are represented as ellipses), the first leg 126A of the first manifold 120 is fluidically connected to the first trunk inlet 138A, and the first leg 130A of the second manifold 122 is fluidically connected to the second trunk inlet 138B.

Similarly, manifold trunk 134B includes a first trunk inlet 140A and a second trunk inlet 140B, the second leg 126B of the first manifold 120 is fluidically connected to the first trunk inlet 140A, and the second leg 130B of the second manifold 122 is fluidically connected to the second trunk inlet 140B. For the manifold trunk 134C, it includes a first trunk inlet 142A and a second trunk inlet 142B, the third leg 126C of the first manifold 120 is fluidically connected to the first trunk inlet 142A, and the third leg 130C of the second manifold 122 is fluidically connected to the second trunk inlet 142B. Finally, for the manifold trunk 134D, it includes a first trunk inlet 144A and a second trunk inlet 144B, and the fourth leg 126D of the first manifold 120 is fluidically connected to the first trunk inlet 144A, and the fourth leg 130D of the second manifold 122 is fluidically connected to the second trunk inlet 144B.

Based on these arrangements and configurations, each leg of the first manifold 120 is fluidically connected to a different one of the manifold trunks 134A-D than the other legs, and each leg is fluidically connected to a corresponding processing station 104A-D, respectively. The first manifold 120 is therefore fluidically connected to each processing station 104A-D with one leg fluidically connecting the first manifold 120 to one corresponding processing station. Further, each leg of the second manifold 122 is fluidically connected to a different one of the manifold trunks 134A-D than the other legs, and each leg is fluidically connected to a corresponding processing station 104A-D, respectively. The second manifold 122 is therefore fluidically connected to each processing station with one leg fluidically connecting the second manifold 122 to one corresponding processing station.

Additional features and flow elements of the multi-station tool 100 will now be discussed. Some of these features were not included in FIG. 1 for clarity purposes but are illustrated in other Figures provided herein. Some of these features include orifices and valves. As mentioned above, in order to create a choked flow regime in each leg of each manifold that flows into a manifold trunk, the multi-station tools provided herein may use a plurality of flow restrictors, such as orifices, that may each be fluidically connected to one corresponding leg of each manifold and fluidically positioned upstream of the trunk inlet to which that leg is fluidically connected. Each orifice creates the choked flow by having a hole diameter less than the inner diameter of the manifold leg fluidically connected to that orifice, such as a hole diameter less than or equal to about 50%, about 40%, about 25%, about 20%, about 10%, or about 5%, for example, of the leg inner diameter.

An example orifice and orifice plate are illustrated in FIGS. 2A-2D. FIG. 2A depicts an off-angle view of an example orifice positioned within an orifice plate and FIG. 2B depicts an exploded view of the orifice and orifice plate of FIG. 2A. The orifice 246 (encircled by a dashed ellipse in FIG. 2B) has an orifice body 247 and a hole 249 that extends through the orifice body 247. The orifice body 247 is positioned within an orifice plate 251 and in the depicted embodiment, is positioned on a seat 253 within a bore 257 of the orifice plate 251. In some embodiments, the orifice body may be swaged into the orifice plate through a swage process in which the orifice plate material is deformed around the orifice body to encapsulate the orifice into the orifice plate.

FIG. 2C depicts a cross-sectional side view of the orifice and orifice plate of FIG. 2A. The orifice 246, orifice body 247, and the hole 249 are seen and the hole has a diameter D1. The orifice body 247 is positioned on the seat 253 of the orifice plate 251 and the orifice plate has been deformed around the orifice body 247 (some representative deformation is identified with identifier 241). FIG. 2D depicts the cross-sectional side view of the orifice and orifice plate of FIG. 2C along with a section of piping 253; this piping 253 that represents a manifold leg or manifold piping fluidically connected to that orifice. The orifice 247 creates the choked flow in the manifold leg by having the hole diameter D1 less than the inner diameter of the manifold leg fluidically connected to that orifice, here inner diameter D2 of the piping 253. For example, the hole 249 diameter D1 may be less than or equal to about 50%, about 40%, about 25%, about 20%, about 10%, or about 5%, for example, of the leg inner diameter D2.

In some embodiments, the orifice body may be comprised of a ruby material. This material may enable lower manufacturing tolerances and therefore a more accurate and precise hole diameter and resulting flow control. The lower the tolerances of each hole diameter, the less variance there is between each orifice body and the more uniform the station-to-station flow is using such orifices. In some embodiments, using ruby may enable the hole to be formed with laser drilling which, in some instances, may have lower tolerances and therefore may be more precise machine drilling. In other implementations, the hole may be formed with machine drilling. In some other embodiments, the orifice body may be made of another material or materials, such as an aluminum, an aluminum allow, or a dielectric material such as a ceramic.

Figure 3:
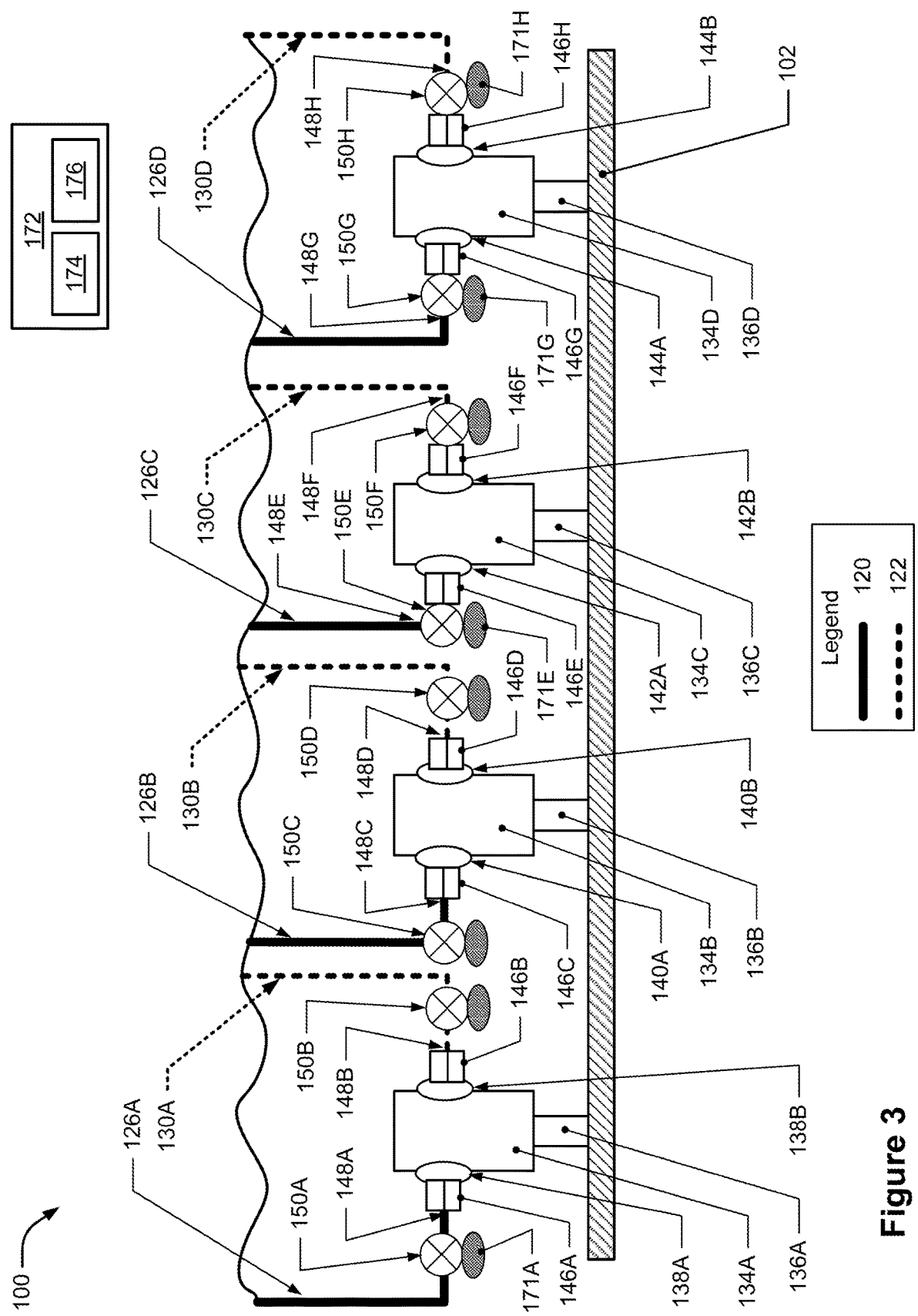
FIG. 3 depicts a magnified portion of the multi-station tool of FIG. 1.

The plurality of flow restrictors, such as an orifice of FIGS. 2A-D, are not shown in FIG. 1, but are illustrated in FIG. 3 which depicts a magnified portion of the multi-station tool of FIG. 1. Here, a horizontal band of the multi-station tool 100 is shown and includes the top of the processing chamber 102, the station inlets 136A-D, the manifold trunks 134A-D and their respective trunk inlets 138A, 138B, 140A, 140B, 142A, 142B, 144A, and 144B, sections of the legs 126A-D of the first manifold 120, and sections of the legs 130A-D of the second manifold 122. The plurality of orifices 146A-H are also depicted in FIG. 3 and are represented by a rectangle with a horizontal line.

As can be seen in FIG. 3, each orifice 146A-H of the plurality of orifices is fluidically connected with one corresponding trunk inlet 138A, 138B, 140A, 140B, 142A, 142B, 144A, and 144B, respectively, of each manifold trunk 134A-D. For example, orifice 146A is fluidically connected to and corresponds with trunk inlet 138A, orifice 146B is fluidically connected to and corresponds with trunk inlet 138B, orifice 146C is fluidically connected to and corresponds with trunk inlet 140A, orifice 146D is fluidically connected to and corresponds with trunk inlet 140B, and orifice 146E is fluidically connected to and corresponds with trunk inlet 142A.

These orifices 146A-H are also fluidically interposed between the respective trunk inlet and leg fluidically connected to that respective trunk inlet such that fluid flowing from a leg to a trunk inlet flows through an orifice. In some implementations, each of the legs of the first and second manifolds also have a termination point fluidically connected to a corresponding orifice such that each orifice is fluidically interposed between the leg and the corresponding trunk inlet. For instance, leg 126A of the first manifold 120 has a termination point 148A that is upstream of the orifice 146A, fluidically connected to the orifice 146A and to the trunk inlet 138A, and positioned such that the orifice 146A is fluidically interposed between the termination point 148A and the corresponding trunk inlet 138A. This fluidic interposition causes fluid to flow from the leg's termination point 148A through the corresponding orifice 146A and to the corresponding trunk inlet 138A.

In another instance, leg 130A of the second manifold 122 has a termination point 148B that is upstream of the orifice 146B, fluidically connected to the orifice 146B and to the trunk inlet 138B, and positioned such that the orifice 146B is fluidically interposed between the termination point 148B and the corresponding trunk inlet 138B. This fluidic interposition causes fluid to flow from the termination point 148B through the corresponding orifice 146B and to the corresponding trunk inlet 138B. The remaining termination points 148C-H are included in FIG. 3 for each leg 126B-D of the first manifold 120 and each leg 130B-D of the second manifold 122 and are arranged with similar fluidic positioning.

Figure 4:
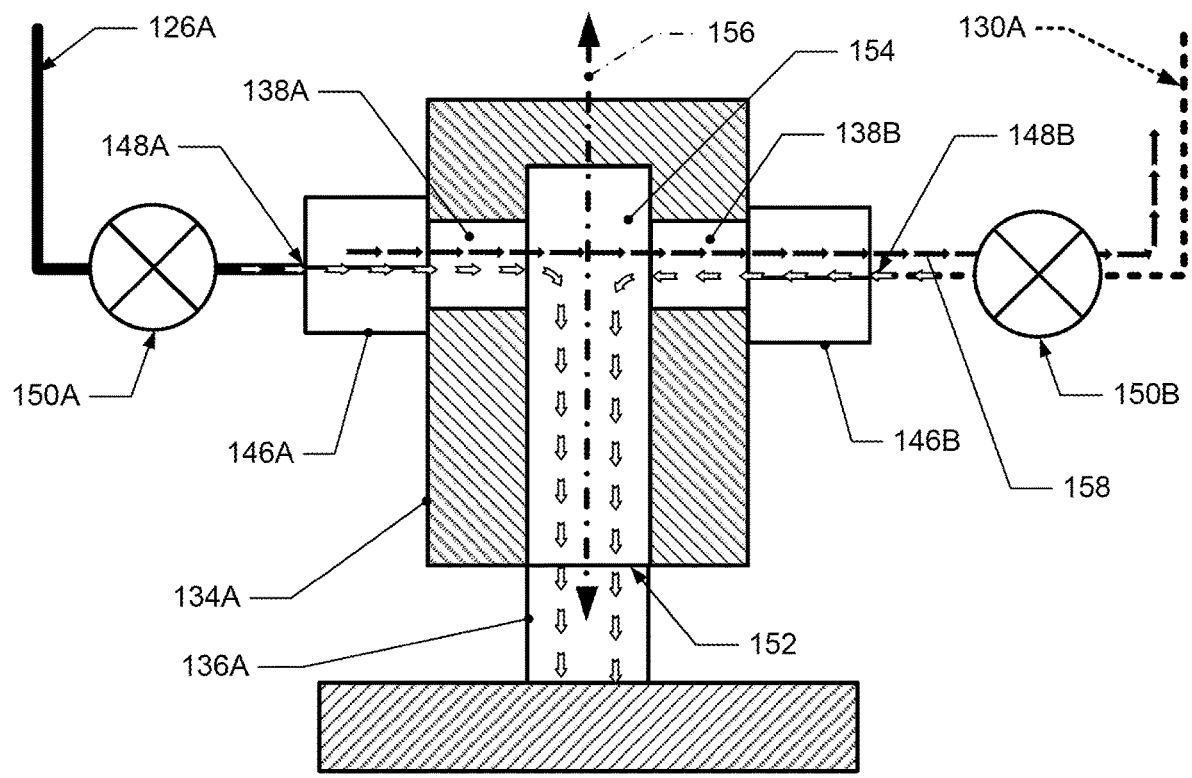
FIG. 4 depicts a magnified, cross-sectional side view of one manifold trunk, a corresponding station inlet, two orifices, and portions of two manifold legs of FIG. 3.

Some additional features of the manifold trunks will now be discussed. As provided above, the manifold trunks are configured to allow fluid to flow through each trunk inlet and to the corresponding station inlet. This configuration may include each manifold trunk having an outlet fluidically connected to the corresponding station inlet and a common flowpath fluidically connected to each trunk inlet and the station inlet, and arranged such that fluid that flows through each inlet travels through the common flowpath to the outlet. FIG. 4 depicts a magnified, cross-sectional side view of one manifold trunk, a corresponding station inlet, two orifices, and portions of two manifold legs of FIG. 3. The manifold trunk 134A here has an outlet 152 that is fluidically connected to the station inlet 136A and the port through which fluid exits the manifold trunk 134A and enters the station inlet 136A.

The manifold trunk 134A also includes the common flowpath 154 that extends through the manifold trunk and in some implementations, as shown in FIG. 4, follows a linear path along axis 156 that extends along the length of the manifold trunk 134A. In some instances, the common flowpath spans between the outlet and the opposite end of the manifold trunk (the top of the manifold trunk 134A in FIG. 4). The first trunk inlet 138A and the second trunk inlet 138B are fluidically connected to the common flowpath 154 and arranged such that fluid that flows through each trunk inlet, as indicated by the small directional arrows, flows into the common flowpath 154, to the outlet 152, and to the corresponding station inlet 136A for that manifold trunk 134A. FIG. 4 also includes a portion of the leg 126A of the first manifold 120 fluidically connected to orifice 146A and the first trunk inlet 138A, as well as a portion of the leg 130A of the second manifold 122 fluidically connected to orifice 146B and the second trunk inlet 138B.

As provided above, undesirable cross-talk may occur between manifolds and manifold trunks that do not have isolation valves. An illustration of this cross-talk is seen in FIG. 4. Here, undesirable cross-talk may include fluid flowing through leg 126A of the first manifold 120, into the manifold trunk 134A, and instead of flowing to the station inlet 136A, the fluid may flow through the manifold trunk 134A, out the trunk inlet 138B and into leg 130A of the second manifold 122. This cross-talk is represented by black arrows 158. This cross-talk fluid may then flow into another leg of the second manifold 122, such as leg 130B and into the station inlet 136B and corresponding station 104B (not pictured in FIG. 4).

In order to prevent this unwanted cross-talk, some embodiments provided here may use valves to prevent cross-talk between the first and second manifolds. This may include having valves at each manifold trunk to prevent fluid from flowing through one manifold, into the manifold trunk, and into the other manifold. FIG. 4 includes a valve 150A fluidically connected to the first leg 126A and configured to prevent fluid from flowing through the leg 126A to the trunk inlet 138A, and also prevent fluid from flowing in the reverse direction through the trunk inlet 138A and into the leg 126A. Another valve 150B is also seen fluidically connected to the other leg 130A and configured in the same manner as valve 150A to prevent flow between the trunk inlet 138B and the other leg 130A.

These valves and their arrangements are further depicted in and explained with respect to FIG. 3. The multi-station tool 100 here includes a plurality of valves 150A-H that are configured to regulate flow between each leg of each manifold and the corresponding trunk inlet for each leg. As shown in FIG. 3, each valve 150A-H is fluidically connected to one corresponding leg of a manifold and configured to regulate fluid flow between that leg and the corresponding trunk inlet. For example, similar to FIG. 4, valve 150A is fluidically connected to leg 126A of the first manifold 120, to the orifice 146A, and to the trunk inlet 138A of the manifold trunk 134A. This valve 150A is configured to regulate fluid flow between the leg 126A and the corresponding orifice 146A as well as the corresponding trunk inlet 138A. In another example, valve 150D is fluidically connected to leg 130B of the second manifold 122, to the orifice 146B, and to the trunk inlet 140B of the manifold trunk 134B such that this valve 150D is capable of regulating fluid flow between the leg 130B and the corresponding orifice 146D and trunk inlet 140B.

The valves may be positioned in various manners to regulate the fluid flow between each leg and the corresponding orifice and trunk inlet fluidically connected to that leg. In one example, a valve may be fluidically connected to the orifice, including being directly interfaced with the orifice, and a corresponding manifold leg may terminate at that valve such that fluid flows through the valve to the corresponding orifice and trunk inlet. Valves 150E-H are illustrates as examples of valves directly interfaced with orifices 146E-H, respectively; these valves 150E-H also are where the termination points 148E-H of the legs 126C, 130C, 126D are located. In another example, a valve may be positioned along a leg and interposed between the leg's termination point and the common input of that leg's manifold. In these implementations, the leg may terminate at the orifice, such as illustrated with valves 150A-D, orifices 146A-D, and termination points 148A-D of legs 126A, 130A, 126B, and 130B, respectively.

In some implementations, the manifold trunks may include valve interfaces that are each configured to interface with one of the valves. The valve interface may include a planar surface and connection features, such as threaded bores, holes through which bolts may pass, threaded hole into which threaded screws may be inserted, or other features to enable fastening a valve to the manifold trunk. In some instances, the valve interface may be a surface mount interface and the valve may be a surface mount valve. The valve interface may also include a threaded bore for directly threading a valve into that bore.

In some embodiments, an orifice may include the valve interface and the valve may be connected directly to that valve interface and orifice. The orifice may have the valve interface provided as part of the orifice, such as a part of the orifice body. In some embodiments, the orifice may be connected to another part that contains the interface features, such as the orifice plate of FIGS. 2A-D having the interface feature. The interface features of an orifice plate may include a planar surface against which a valve piston may seat and seal the orifice hole, as well as securement features to connect the valve to the orifice plate, including holes, threaded connections, clamps, and the like. In some implementations, the orifice plate may be removably connected to the manifold trunk. This removable connection may involve bolts, clamps, or screws, for example. Using a removable connection enables the orifice plate to be replaced with a different sized orifice to provide different flow control, for example.

Figure 5A:
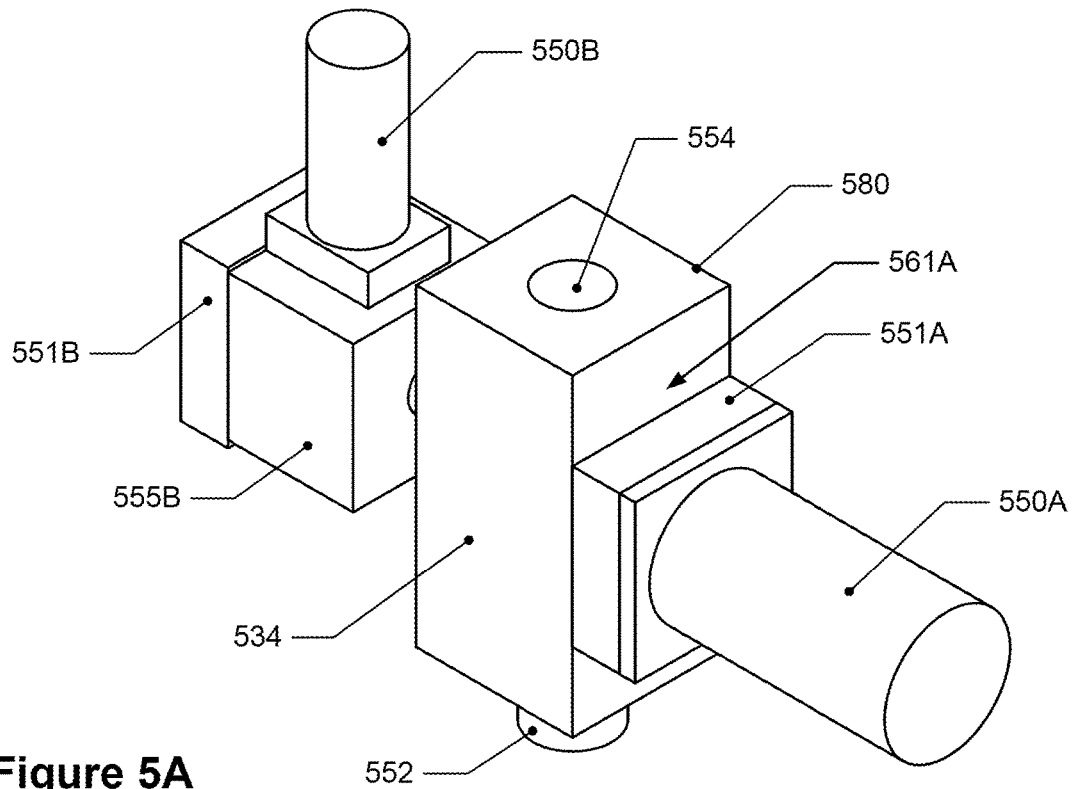
FIG. 5A depicts an off-angle view of another example manifold trunk with two orifice plates and two valves.
Figure 5B:
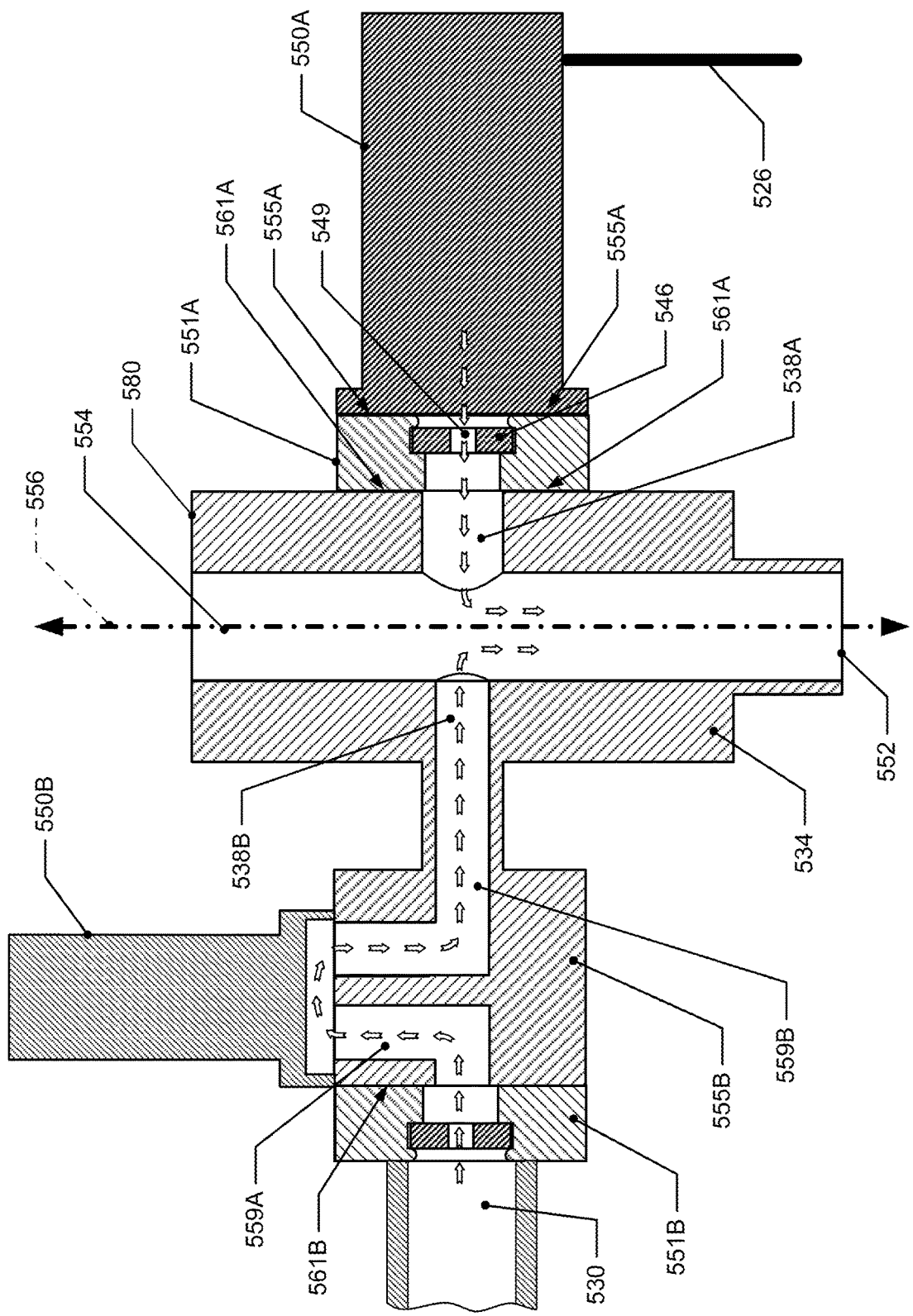
FIG. 5B depicts a cross-sectional side view of FIG. 5A.

FIG. 5A depicts an off-angle view of another example manifold trunk with two orifice plates and two valves and FIG. 5B depicts a cross-sectional side view of FIG. 5A. In FIG. 5, the manifold trunk 534 is visible along with its common flowpath 554 that flows through the manifold trunk 534 and extends through the end 580 of the manifold trunk 534. The manifold trunk 534 also includes the outlet 552 fluidically connected to the common flowpath 554. A first valve 550A is seen interfaced with a first orifice plate 551A, a second valve 550B is interfaced with an interface feature 555B, and a second orifice plate 551B is interfaced with the interface feature 555B. The first orifice plate 551A is mounted or connected to a mounting surface 561A of the manifold trunk 534 and the second orifice plate 551B is mounted or connected to another mounting surface 561B of the interface feature 555B of the manifold trunk 534. Each mounting surface of the manifold trunk may be configured to receive and connect with an orifice plate which may include having a planar surface to create a sealed surface with the orifice plate, a seal or other gasket, an additional securement plate, holes for receiving bolts, screws, or features for receiving clamps.

In FIG. 5B, additional features are visible. The common flowpath 554 extends from one end of the manifold trunk 534 to the outlet 552, which may include along a linear axis 556, and fluidically connected to a first trunk inlet 538A and a second trunk inlet 538B of manifold trunk 534. The first orifice plate 551A, which is the same as in FIGS. 2A-D, is connected to the manifold trunk 554 such that the orifice 546, including the hole 549, is fluidically connected to the first trunk inlet 538A. The first orifice plate 551A includes a valve interface, which includes a surface 555A identified in FIG. 5B and in FIG. 2A as item 255, to which the first valve 550A may be connected and interfaced. For the first valve 550A, the manifold leg 526 of one manifold terminates at the first valve 550A such that the leg 526 is fluidically connected via the first valve 550A to the orifice 546 of the orifice plate 551A and the first trunk inlet 538A. Fluid may therefore flow from the leg 526 to the first valve 550A and then to the orifice 546 and the first trunk inlet 538A. The orifice 546 is also fluidically interposed between the first inlet 538A and the first valve 550A and the termination point of the leg 526.

For the second inlet 538B, a different arrangement is depicted that utilizes an interface feature, shown as a block 555B, which has two flowpaths 559A and 559B through which fluid may flow. The second orifice plate 551B, also the same as that in FIGS. 2A-D, is connected to the interface feature, block 555B, and the leg 530 of a manifold terminates at the second orifice plate 551B. The second orifice plate 551B, including its orifice, is fluidically interposed between the second inlet and the termination point of the leg 530. Fluid may flow from the leg 530 to the second inlet 538B by flowing through the orifice of the orifice plate 551B, through the two flowpaths 559A and 559B and past the second valve 550B, and through the second inlet 538B. This flow path is illustrated by the small line of arrows. The second valve 550B is interfaced with the interface feature, block 555B, and is movable to stop flow travelling between flowpaths 559A and 559B; FIG. 5B illustrates an open position allowing for flow as indicated by the arrows.

Figure 6:
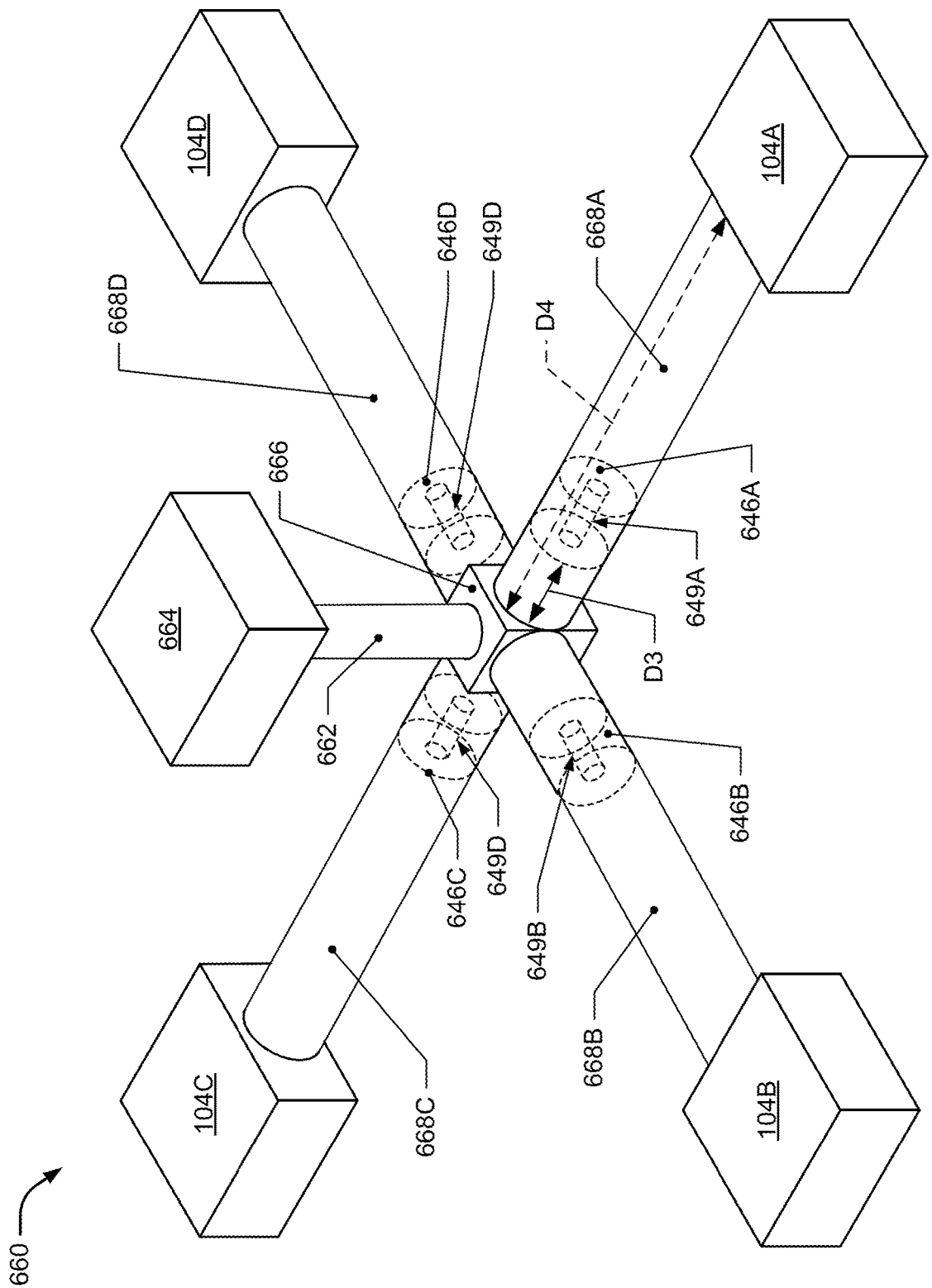
FIG. 6 depicts another example manifold.

In some embodiments, one of the manifolds may include a plurality of legs that may have, in some embodiments, equal or substantially lengths as each other and that all extend away from a single multi-leg junction that provides a single split from a common input. FIG. 6 depicts another example manifold. This manifold 660 includes a common input 662 fluidically connected to a gas source 664, as well as a multi-leg junction 666 that splits the common input 662 into the same number of flowpaths as there are legs. In this example, there are four legs 668A-D and the multi-leg junction is therefore a single 4-way split to each leg 668A-D and each leg 668A-D extends away from this multi-leg junction 666. Each leg 668A-D is also fluidically connected to a single station of a multi-station tool, as represented by stations 104A-D, respectively, in FIG. 6. The multi-leg junction 666 may be fluidically interposed between the common input 662 and the legs 668A-D. Each leg also includes a flow restrictor, such as orifices 646A-D, that are in-line with each leg. The orifices 664A-D are illustrated with dashed lines to show that these are internal features. The shape of the holes of these orifices may, in some instances, be a cylindrical shape as depicted in FIG. 6, while in other implementations, these holes may have a tapered or non-linear geometry.

Similar to above, each of these orifices 646A-D have a hole 649A-D, respectively, that has a diameter less than the inner diameter of the leg to which it is connected. For example, the diameter of the holes 649A-D may be less than or equal to about 50%, about 40%, about 25%, about 20%, about 10%, or about 5% of the leg inner diameter. Each orifice 646A-D may also be positioned relatively close to the multi-leg junction 666 for one or more advantageous reasons such as allowing the choked flow downstream of each orifice 646A-D to equalize and also to be heated for a longer period of time. This positioning may be a distance D3 from the multi-leg junction 666 that is less than or equal to 20%, 15%, 10%, or 5% of the overall length D4 of each leg to which the orifice is connected. In some embodiments, as depicted in FIG. 6, the legs may all have equal or substantially equal lengths; in some other embodiments they may not have the same lengths.

In some embodiments, the multi-station tool may have a plurality of sensors associated with the plurality of valves and configured to determine whether each valve is open or closed and the multi-station tool is configured to receive this sensor data and control each valve to be in a closed state, fully open state, or partially open state. Referring back to FIG. 3, the multi-station tool 100 includes a plurality of sensors, each represented as a shaded ellipse and some of which are labeled with identifiers 171 and a letter corresponding with the letter of the valve to which it is connected. For example, sensor 171G corresponds with valve 150G and sensor 171E corresponds with valve 150E. As can be seen, each sensor is associated with one corresponding valve and each sensor is configured to generate sensor data associated with whether that valve is in a closed state, fully open state, or partially open state.

In some embodiments, the multi-station tools described herein may include a controller that is configured to control various aspects of the multi-station tool. For example, referring to FIGS. 1 and 3, the controller 172 is shown with one or more memory devices 174 and one or more processors 176. The controller 172 (which may include one or more physical or logical controllers) is communicatively connected with and controls some or all of the operations of the multi-station tool, including the valves, sensors, and fluid sources, for instance. The controller 172 may be configured to cause fluid from each of the fluid sources, such as the first and second fluid sources 116 and 118, to flow into the corresponding common input of the manifold fluidically connected to each gas source.

The controller may also be configured to receive the sensor data from each of the sensors, determine whether each sensor is in a closed state, fully open state, or partially open state, and cause each sensor to be in a closed state, fully open state, or partially open state. This may be advantageous for preventing cross-talk between manifolds and having uniform flow within a desired manifold. For example, referring to FIG. 1, before or while flowing fluid from the first fluid source 116 through the first manifold 120, the controller may determine, based on the received sensor data, whether each valve 150A, 150C, 150E, and 150G in the first manifold 120 is fully or partially open, and whether each valve 150B, 150D, 150F, and 150G in the second manifold 122 are in a closed state, fully open state, or partially open state. If any of these valves 150B, 150D, 150F, and 150G in the second manifold 122 are in a closed state, fully open state, or partially open state before or while flowing fluid from the first fluid source 116 through the first manifold 120, the controller may cause these valves 150B, 150D, 150F, and 150G to be in a closed state.

In some embodiments, the multi-station tools includes a switching system for controlling flowrates and durations, the substrate heating unit, the substrate cooling unit, the loading and unloading of a substrate in the chamber, the thermal floating of the substrate, and the process gas unit, for instance, when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, the controller 172 is part of an apparatus or a system, which may be part of the above-described examples. Such systems or apparatuses can include semiconductor processing equipment, including a processing tool or tools, chamber or chambers, a platform or platforms for processing, and/or specific processing components (a gas flow system, a substrate heating unit, a substrate cooling unit, etc.). These systems may be integrated with electronics for controlling their operation before, during, and after processing of a semiconductor wafer or substrate. The electronics may be referred to as the "controller," which may control various components or subparts of the system or systems. The controller 766, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flowrate settings, fluid delivery settings, positional and operation settings, wafer transfers into and out of a tool and other transfer tools and/or load locks connected to or interfaced with a specific system.

Broadly speaking, the controller 172 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 172, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 766 receives instructions in the form of data, which specify parameters for each of the processing operations to be performed during one or more operations. It should be understood that the parameters may be specific to the type of process to be performed and the type of tool that the controller is configured to interface with or control. Thus as described above, the controller 766 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process operation or operations to be performed by the apparatus, the controller 172 might communicate with one or more of other apparatus circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A system comprising:
   a semiconductor processing chamber having a plurality of processing stations, each processing station including a station inlet;
   a plurality of manifold trunks, wherein each manifold trunk is fluidically connected to a corresponding processing station and includes:
      an outlet fluidically connected to the station inlet of the corresponding processing station,
      a common flowpath fluidically connected to the outlet,
      a plurality of trunk inlets fluidically connected to the common flowpath such that fluid flows from each trunk inlet to the outlet via the common flowpath,
      a plurality of orifices, each orifice having an orifice body and a hole extending through the orifice body, and each orifice fluidically connected to a corresponding trunk inlet such that each trunk inlet is fluidically interposed between a corresponding orifice and the common flowpath, and
      a plurality of valve interfaces, each valve interface corresponding to each orifice of the manifold trunk,
   a plurality of valves, each valve interfaced with a corresponding valve interface of each manifold trunk; and
   a plurality of fluid manifolds, wherein:
      each fluid manifold has a common input fluidically connected to a plurality of legs,
      for each fluid manifold, each leg:
         is fluidically connected to a different one of the manifold trunks than the other legs, and
         has a termination point fluidically connected to a corresponding orifice at each one of the manifold trunks such that the corresponding orifice is fluidically interposed between the termination point and the corresponding manifold inlet, and
      each valve is configured to regulate fluid flow between one corresponding leg and the corresponding orifice.

2. The system of claim 1, wherein one of the manifold trunks further includes an orifice plate, wherein:
   the orifice plate includes one orifice and one valve interface of the manifold trunk,
   one of the valves is interfaced with the valve interface of the orifice plate, and
   the orifice plate is interposed between the one valve and the trunk inlet that corresponds to the one orifice.

3. The system of claim 2, wherein each manifold trunk further includes a plurality of orifice plates, wherein:
   each orifice plate includes one corresponding orifice and one corresponding valve interface of the manifold trunk,
   each valve is interfaced with the valve interface of a corresponding orifice plate, and
   each orifice plate is interposed between each corresponding valve and one of the trunk inlets that corresponds to the corresponding orifice.

4. The system of claim 2, wherein the orifice is swaged into the orifice plate.

5. The system of claim 2, wherein the orifice plate is removably connected to the manifold trunk.

6. The system of claim 1, wherein the orifice body comprises ruby.

7. The system of claim 1, wherein:
   each manifold leg includes a delivery line with an inner diameter, and
   each hole of each orifice has a diameter that is less than 40% of the inner diameter.

8. The system of claim 7, wherein each hole of each orifice has a diameter that is less than 20% of the inner diameter.

9. The system of claim 1, wherein:
each valve interface is a surface mount interface, and
each valve is a surface mount valve.

10. The system of claim 1, wherein:
each manifold leg terminates at a corresponding valve, and
the corresponding valve is fluidically connected to the orifice.

11. The system of claim 1, wherein each manifold leg terminates at a corresponding valve interface.

12. The system of claim 1, wherein the manifold trunk is positioned outside the processing chamber.

13. The system of claim 1, wherein the legs of each manifold are substantially the same length.

14. The system of claim 1, wherein:
the semiconductor processing chamber includes a first processing station and a second processing station,
the plurality of manifold trunks includes a first manifold trunk and a second manifold trunk,
the plurality of manifolds includes a first manifold and a second manifold, each manifold having two legs,
the first manifold trunk is fluidically connected to a first station inlet of the first processing station,
the second manifold trunk is fluidically connected to a second station inlet of the second processing station,
a first leg of the first manifold is fluidically connected to a first trunk inlet of the first manifold trunk such that a first orifice of the first manifold trunk is fluidically interposed between the first trunk inlet of the first manifold trunk and a termination point of the first leg of the first manifold,
a second leg of the first manifold is fluidically connected to a first trunk inlet of the second manifold trunk such that a first orifice of the second manifold trunk is fluidically interposed between the first trunk inlet of the second manifold trunk and a termination point of the second leg of the first manifold,
a first leg of the second manifold is fluidically connected to a second trunk inlet of the first manifold trunk such that a second orifice of the first manifold trunk is fluidically interposed between the second trunk inlet of the first manifold trunk and a termination point of the first leg of the second manifold, and
a second leg of the second manifold is fluidically connected to a second trunk inlet of the second manifold trunk such that a second orifice of the second manifold trunk is fluidically interposed between the second trunk inlet of the second manifold trunk and a termination point of the second leg of the second manifold.

15. The system of claim 14, wherein:
the semiconductor processing chamber further includes a third processing station and a fourth processing station,
the first manifold and the second manifolds each have four legs,
the plurality of manifold trunks further includes a third manifold trunk and a fourth manifold trunk,
the third manifold trunk is fluidically connected to a third station inlet of the third processing station,
the fourth manifold trunk is fluidically connected to a fourth station inlet of the fourth processing station,
a third leg of the first manifold is fluidically connected to a first trunk inlet of the third manifold trunk such that a first orifice of the third manifold trunk is fluidically interposed between the first trunk inlet of the third manifold trunk and a termination point of the third leg of the first manifold,
a fourth leg of the first manifold is fluidically connected to a first trunk inlet of the fourth manifold trunk such that a first orifice of the fourth manifold trunk is fluidically interposed between the first trunk inlet of the fourth manifold trunk and a termination point of the fourth leg of the first manifold,
a third leg of the second manifold is fluidically connected to a second trunk inlet of the third manifold trunk such that a second orifice of the third manifold trunk is fluidically interposed between the second trunk inlet of the third manifold trunk and a termination point of the third leg of the second manifold, and
a fourth leg of the second manifold is fluidically connected to a second trunk inlet of the fourth manifold trunk such that a second orifice of the fourth manifold trunk is fluidically interposed between the second trunk inlet of the fourth manifold trunk and a termination point of the fourth leg of the second manifold.

16. The system of claim 1, further comprising:
a plurality of sensors, wherein each sensor is configured to generate sensor data associated with whether a corresponding valve is open or closed, and
a controller communicatively connected to the plurality of valves and to the plurality of sensors, and comprising at least one memory and at least one processor, the memory stores computer-executable instructions for:
receiving sensor data from the plurality of sensors,
determining, based on the sensor data, whether each of the valves fluidically connected to one manifold is open or closed,
determining, based on the sensor data, whether each of the valves fluidically connected to the other manifolds of the plurality of manifolds is open or closed,
causing, in response to determining that one of valves fluidically connected to the one manifold are closed, that one valve to open, and
causing, in response to determining that one of valves fluidically connected to the other manifolds of the plurality of manifolds are open, that one valve to close.

17. The system of claim 1, further comprising at least one second manifold of the plurality of fluid manifolds, wherein:
the second manifold includes a second common input, a multi-leg junction, and a plurality of second legs that are fluidically connected to and extend away from the multi-leg junction such that the multi-leg split is interposed between the second common input and the plurality of second legs,
the multi-leg junction includes a number of splits that matches the number of second legs,
each second leg includes a second delivery line with a second inner diameter,
the second manifold further includes a plurality of second orifices, and
each second orifice:
includes a hole and a body, and the hole has a diameter that is less than 40% of the second inner diameter,
is arranged along a corresponding second leg such that fluid flowing through the second leg flows through a second orifice, and
is positioned at a distance from the multi-leg junction that is less than 20% of the length of the second leg to which the second orifice is connected.

18. The system of claim 17, wherein the second legs are substantially equal in length.

19. A system comprising:
a semiconductor processing chamber having a plurality of processing stations, each processing station including a station inlet; and
a manifold that includes a common input, a multi-leg junction, a plurality of orifices, and a plurality of legs that are fluidically connected to and extend away from the multi-leg junction such that the multi-leg split is interposed between the common input and the plurality of legs, wherein:
the multi-leg junction includes a number of splits that matches the number of legs,
each leg is fluidically connected to a corresponding station inlet of the plurality of processing stations, and
each orifice:
is arranged along a corresponding leg such that fluid flowing through the leg flows through an orifice, and
is positioned a distance from the multi-leg junction that is less than 20% of the length of the leg to which the orifice is connected.

20. The system of claim 19, wherein each leg of the plurality of legs is substantially equal in length.

21. A manifold trunk for use in a semiconductor processing tool, the manifold trunk comprising:
an outlet and an end opposite the outlet;
a common flowpath fluidically connected to the outlet;
a plurality of trunk inlets fluidically connected to the common flowpath such that fluid flows from each trunk inlet to the outlet via the common flowpath;
one or more mounting surfaces;
a plurality of orifice plates, wherein each orifice plate:
has an orifice body and a hole in the orifice body, the hole fluidically connected to a corresponding trunk inlet such that each trunk inlet is fluidically interposed between a corresponding orifice and the common flowpath, and
is mounted to one of the mounting surfaces; and
a plurality of valve interfaces, wherein:
each valve interface corresponds to each orifice plate, when a valve is interfaced at one of the valve interfaces, the valve is capable of regulating fluid flow between the orifice and a manifold leg, and the orifice plate is interposed between the valve and the trunk inlet that corresponds to the orifice plate.

22. The manifold trunk of claim 21, wherein each orifice is swaged into the corresponding orifice plate.

23. The manifold trunk of claim 21, wherein the orifice plate is removably connected to the manifold trunk.

24. The manifold trunk of claim 21, wherein the orifice body comprises ruby.

* * * * *